(12) United States Patent
Tsukiyama et al.

(10) Patent No.: US 9,570,414 B2
(45) Date of Patent: Feb. 14, 2017

(54) SEMICONDUCTOR DEVICE AND METHOD OF MANUFACTURING THE SEMICONDUCTOR DEVICE

(71) Applicant: KABUSHIKI KAISHA TOSHIBA, Tokyo (JP)

(72) Inventors: Satoshi Tsukiyama, Yokohama Kanagawa (JP); Masatoshi Fukuda, Yokohama Kanagawa (JP); Yukifumi Oyama, Yokkaichi Mie (JP); Shinya Fukayama, Nagoya Aichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 80 days.

(21) Appl. No.: 14/474,686

(22) Filed: Sep. 2, 2014

(65) Prior Publication Data
US 2015/0123270 A1    May 7, 2015

(30) Foreign Application Priority Data
Nov. 6, 2013    (JP) .................................. 2013-230650

(51) Int. Cl.
*H01L 21/00* (2006.01)
*H01L 23/00* (2006.01)
(Continued)

(52) U.S. Cl.
CPC ............... *H01L 24/81* (2013.01); *H01L 24/13* (2013.01); *H01L 24/14* (2013.01); *H01L 24/17* (2013.01); *H01L 25/074* (2013.01); *H01L 25/50* (2013.01); *H01L 21/563* (2013.01); *H01L 23/544* (2013.01); *H01L 24/11* (2013.01); *H01L 2223/54426* (2013.01); *H01L 2223/54473* (2013.01);
(Continued)

(58) Field of Classification Search
USPC .......................................... 438/109; 257/737
See application file for complete search history.

(56) References Cited

U.S. PATENT DOCUMENTS

| 6,037,666 | A | 3/2000 | Tajima |
| 7,242,099 | B2 * | 7/2007 | Lin ....................... H01L 21/568 257/734 |

(Continued)

FOREIGN PATENT DOCUMENTS

| JP | 1994236981 A | 8/1994 |
| JP | 2003197853 A | 7/2003 |

(Continued)

OTHER PUBLICATIONS

Taiwan Office Action dated Dec. 28, 2015, filed in Taiwan counterpart Patent Application No. 103123047, 7 pages (with English translation).

*Primary Examiner* — Telly Green
(74) *Attorney, Agent, or Firm* — Patterson & Sheridan, LLP

(57) ABSTRACT

According to one embodiment, a first electrode is formed on a first face of a first semiconductor chip, and a second electrode and a protrusion are formed on a second face of a second semiconductor chip. The first semiconductor chip and the second semiconductor chip are spaced from one another by the protrusion in such a manner that the first face and the second face face each other. The first semiconductor chip and the second semiconductor chip are subject to reflow to be electrically connected to each other, and then the protrusion is cured at a temperature lower than a reflow temperature.

17 Claims, 6 Drawing Sheets

(51) Int. Cl.
  *H01L 25/00* (2006.01)
  *H01L 25/07* (2006.01)
  *H01L 23/544* (2006.01)
  *H01L 21/56* (2006.01)

(52) U.S. Cl.
  CPC .......... *H01L 2224/10135* (2013.01); *H01L 2224/1131* (2013.01); *H01L 2224/11334* (2013.01); *H01L 2224/13014* (2013.01); *H01L 2224/1319* (2013.01); *H01L 2224/13082* (2013.01); *H01L 2224/13111* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/1403* (2013.01); *H01L 2224/1415* (2013.01); *H01L 2224/14505* (2013.01); *H01L 2224/16146* (2013.01); *H01L 2224/1705* (2013.01); *H01L 2224/17517* (2013.01); *H01L 2224/73204* (2013.01); *H01L 2224/8113* (2013.01); *H01L 2224/81139* (2013.01); *H01L 2224/81193* (2013.01); *H01L 2224/81194* (2013.01); *H01L 2224/81203* (2013.01); *H01L 2224/81815* (2013.01); *H01L 2224/81862* (2013.01); *H01L 2224/81907* (2013.01); *H01L 2224/83104* (2013.01); *H01L 2224/92125* (2013.01); *H01L 2924/35* (2013.01)

(56) References Cited

U.S. PATENT DOCUMENTS

| | | | |
|---|---|---|---|
| 8,294,279 B2 * | 10/2012 | Chen | H01L 21/563 257/686 |
| 2004/0126927 A1 * | 7/2004 | Lin | H01L 21/568 438/107 |
| 2006/0220259 A1 * | 10/2006 | Chen | H01L 21/563 257/778 |
| 2010/0134583 A1 | 6/2010 | Koroishi et al. | |
| 2013/0134583 A1 | 5/2013 | Tsukiyama et al. | |
| 2013/0154076 A1 | 6/2013 | Camacho et al. | |

FOREIGN PATENT DOCUMENTS

| | | |
|---|---|---|
| JP | 2004111695 A | 4/2004 |
| JP | 2007281393 A | 10/2007 |
| TW | 201301464 A | 1/2013 |

* cited by examiner

SEMICONDUCTOR DEVICE AND METHOD OF MANUFACTURING THE SEMICONDUCTOR DEVICE

CROSS-REFERENCE TO RELATED APPLICATION

This application is based upon and claims the benefit of priority from Japanese Patent Application No. 2013-230650, filed Nov. 6, 2013, the entire contents of which are incorporated herein by reference.

FIELD

Embodiments described herein relate generally to a semiconductor device and a method of manufacturing the semiconductor device.

BACKGROUND

To achieve miniaturization and high functionality of a semiconductor device, a semiconductor device having a system in package (SiP) structure in which a plurality of semiconductor chips are laminated in one package and are sealed therein has been developed. In the semiconductor device having the SiP structure, high-speed transmission and reception of electrical signals between semiconductor chips are required. In this case, a micro-bump is used for electrical connection between the semiconductor chips. For example, the micro-bump has a diameter of approximately 5 µm to 50 µm, and is formed on a surface of each of the semiconductor chips and is formed of individual solder bumps having a pitch of approximately 10 µm to 100 µm.

In the semiconductor device, it is preferable to suppress bonding failures at or in the micro-bump.

DETAILED DESCRIPTION

Figure 1:
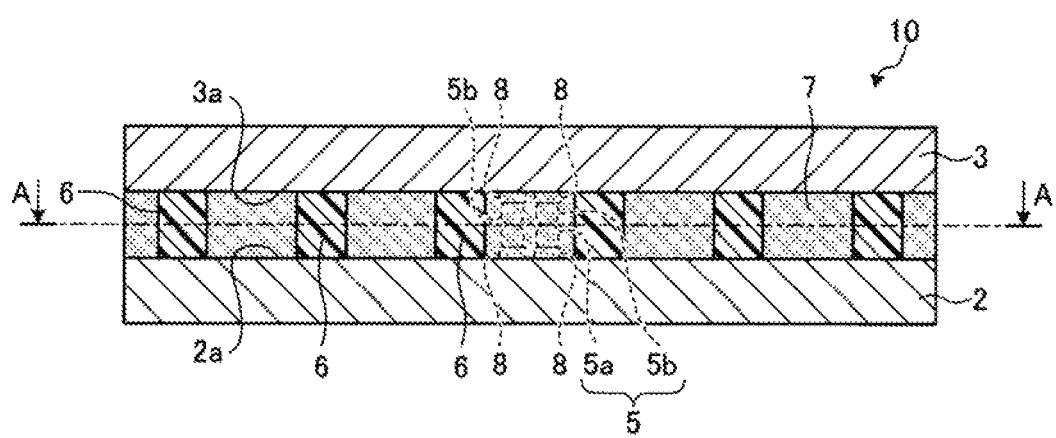
FIG. 1 is a cross-sectional view of a semiconductor device according to a first embodiment.

Embodiments provide a semiconductor device which is capable of suppressing bonding failure of or in a bump and a method of manufacturing the same.

In general, according to one embodiment, there is provided a method of manufacturing a semiconductor device. The method includes forming a first electrode on a first face of a first semiconductor chip, forming a second electrode and a protrusion on a second face of a second semiconductor chip, fixing the first semiconductor chip and the second semiconductor chip together using the protrusion in such a manner that the first face and the second face face each other in a spaced relationship, electrically connecting the first semiconductor chip and the second semiconductor chip at temperature that is higher than a melting point temperature of at least a part of the metals contained in the first electrode and the second electrode, and curing the protrusion at a temperature that is lower than the melting point temperature of the metals contained in the first electrode and the second electrode after electrically connecting the first semiconductor chip and the second semiconductor chip.

Hereinafter, semiconductor devices according to exemplary embodiments will be described in detail with reference to the attached drawings. However, the invention is not limited to the embodiments. For example, description illustrating directions such as a vertical direction and a horizontal direction according to the embodiments represents a relative direction when an upper direction in the drawings is set as an upper side of the depicted structure. That is, a direction illustrated in the embodiments and a direction with a gravitational acceleration direction set as a reference may be different from each other.

First Embodiment

Figure 2:
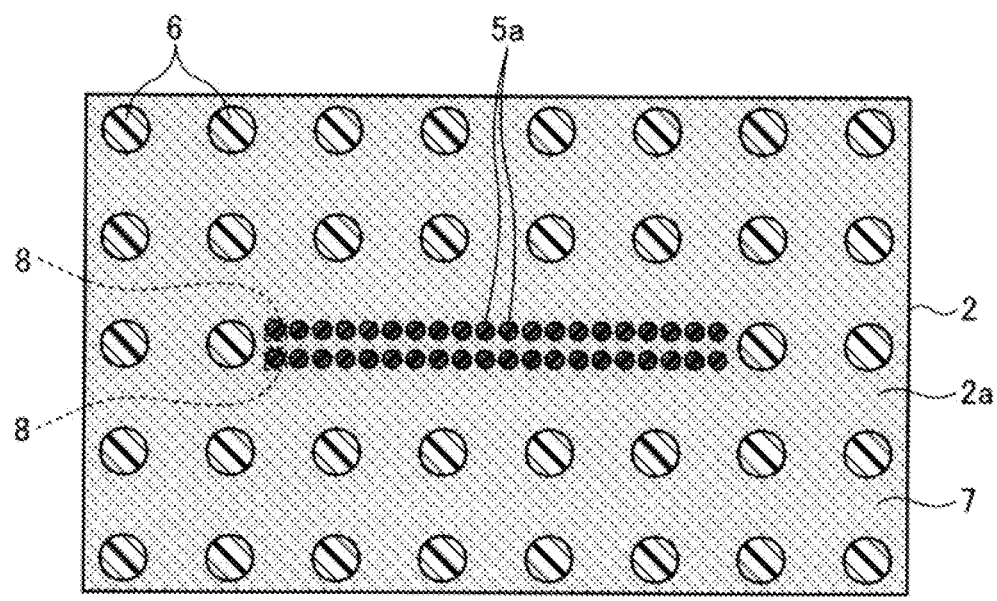
FIG. 2 is a cross-sectional view taken along line A-A illustrated in FIG. 1.

First, a configuration of a semiconductor device will be described. FIG. 1 is a cross-sectional view illustrating a semiconductor device according to a first embodiment. FIG. 2 is a cross-sectional view along line A-A illustrated in FIG. 1. The semiconductor device 10 includes a first semiconductor chip 2 and a second semiconductor chip 3. An upper surface (first face) 2a of the first semiconductor chip 2 includes a first connection region and a first bump electrode 5a is formed in the first connection region. A lower surface (second face) 3a of the second semiconductor chip 3 includes a second connection region that faces the first connection region, and a second bump electrode 5b is formed in the second connection region. The first semiconductor chip 2 including the first face 2a and the second semiconductor chip 3 including the second face 3a are stacked so that the first face 2a and the second face 3a face each other. In addition, the second semiconductor chip 3 is stacked on the first semiconductor chip 2 such that the second bump electrodes 5b are connected to the first bump electrodes 5a. That is, the first semiconductor chip 2 and the second semiconductor chip 3 are electrically and mechanically connected to each other through a connection body (bump connection portion) 5 between the first bump electrodes 5a and the second bump electrodes 5b. The connection region represents a formation region of the first bump electrodes 5a and the second bump electrodes 5b extending from the surfaces 2a, 3a of the semiconductor chips 2, 3. The first bump electrodes 5a and the second bump electrodes 5b represent electrodes that form the bump connection portion at which the first semiconductor chip 2 and the second semiconductor chip 3 are electrically and mechanically connected to each other.

Examples of a material that is used as the first bump electrode 5a and the second bump electrode 5b include solder, gold (Au), and the like. Examples of a combination of the first bump electrode 5a and the second bump electrode 5b include a combination such as solder/solder, gold (Au)/solder, solder/gold (Au), and gold (Au)/gold (Au). Examples of the solder that forms the first bump electrode 5a and the second bump electrode 5b include lead (Pb)-free solder that uses a tin (Sn) alloy obtained by adding copper (Cu), silver (Ag), bismuth (Bi), indium (In), and the like to tin (Sn). Specific examples of the lead (Pb)-free solder include a tin (Sn)-copper (Cu) alloy, a tin (Sn)-silver (Ag) alloy, a tin (Sn)-silver (Ag)-Copper (Cu) alloy, and the like. As the metal that forms the first bump electrode 5a and the second bump electrode 5b, copper (Cu), nickel (Ni), tin (Sn), palladium (Pd), silver (Ag), and the like may be used instead of gold (Au). The metals are not limited to a single layer film, and a stacked film of a plurality of metals may be used. Although examples of the shape of each of the first bump electrodes 5a and the second bump electrodes 5b include a protruding shape such as a hemispherical shape and a columnar shape, the shape may be a flat shape similar to a pad. Examples of a combination of the first bump electrode 5a and the second bump electrode 5b include a combination of protruding bodies, a combination of a protruding body and a flat body, and the like. Herein, the embodiment will be described with reference to an example in which a stacked film of nickel (Ni) and gold (Au) from the first semiconductor chip 2 side is used as the first bump electrode 5a, and a stacked film of nickel (Ni) and lead (Pb)-free solder from the second semiconductor chip 3 side is used as the second bump electrode 5b. The first semiconductor chip 2 and the second semiconductor chip 3 are electrically connected through the bump connection portion 5. Transmission and reception of electrical signals are performed between the first semiconductor chip 2 and the second semiconductor chip 3 through the bump connection portion 5.

Protrusions 6 are provided on at least one region (first non-connection region) of the upper surface 2a of the first semiconductor chip 2 outside the area of the first connection region and are received against a region (second non-connection region) in the lower surface 3a of the second semiconductor chip 3 outside the area of the second connection region. For example, the protrusions 6 are formed with a thermosetting resin such as an epoxy resin, a polyimide resin, an acrylic resin, or a phenolic resin. The protrusions 6 are provided so that a gap between the first semiconductor chip 2 and the second semiconductor chip 3 therewith becomes the connection height of the bump electrodes 5a, 5b extending between the substrates 2, 3. When pressing the first semiconductor chip 2 and the second semiconductor chip 3 together, the gap between these chips is defined by the protrusions 6 heights, and thus the occurrence of excessive collapsing of the bump connection portion 5, connection failure (opening failure) between the bump electrodes 5a, 5b, and the like may be suppressed.

A leading end of the protrusions 6 is bonded to the opposed, mating first non-connection region and the second non-connection region of the opposing substrate. When connecting the first bump electrodes 5a and the second bump electrodes 5b to each other, the protrusions 6 reinforce the connection between the first semiconductor chip 2 and the second semiconductor chip 3. An underfill resin 7 is filled into the gap between the first face 2a of the first semiconductor chip 2 and the second face 3a of the second semiconductor chip 3. Since the protrusions 6 are provided between the first non-connection region of the first semiconductor chip 2 and the second non-connection region of the second semiconductor chip 3, it is possible to increase the strength of the connection between the first semiconductor chip 2 and the second semiconductor chip 3 before filling of the underfill resin 7 therebetween. That is, before filling of the underfill resin 7, the first semiconductor chip 2 and the second semiconductor chip 3 are secured to each other by the protrusions 6 in addition to the bump connection portion 5 configured with the first bump electrodes 5a and the second bump electrodes 5b. Accordingly, it is possible to raise the connection strength between the chips 2, 3 before filling the underfill resin 7 therebetween.

For example, the first bump electrodes 5a provided on the first semiconductor chip 2 and the second bump electrodes 5b provided on the second semiconductor chip 3 are interconnected to each other by compression under heat. Additionally, protective film (passivation film), such as an organic insulating film (insulating film) such as a polyimide resin film is provided on the surface of the semiconductor chips 2, 3. The coefficient of thermal expansion of a silicon substrate that configures the semiconductor chips 2, 3 is approximately 3 microns/° C. In contrast, the coefficient of thermal expansion of the polyimide resin is as large as approximately 35 microns/° C. Therefore, warping of the semiconductor chips 2, 3 is likely during the heating of the chips to connect the electrodes 5a, 5b, and particularly, as the thickness of the semiconductor chips 2, 3 is small, the amount of warpage tends to increase. Here, the connection between the semiconductor chips 2, 3 is reinforced by the protrusions 6, and thus when connecting the bump electrodes 5a, 5b, or after connecting the bump electrodes 5a, 5b, fracturing of the bump connection portion 5, which is configured with the bump electrodes 5a, 5b, due to the warping of the semiconductor chips 2, 3 is suppressed.

The protrusions 6 are locally provided between the semiconductor chips 2, 3. Accordingly, it is possible to increase alignment accuracy between the first semiconductor chip 2 and the second semiconductor chip 3 or connectivity between the first bump electrode 5a and the second bump electrode 5b. For example, in the prior art method of disposing an insulating resin layer such as a non-conductive film (NCF) having a bonding function and a sealing function at the entirety of the gap between the semiconductor chips prior to the bonding of the electrodes 5a, 5b thereof, when aligning the first semiconductor chip 2 and the second semiconductor chip 3, detection accuracy of an alignment mark is reduced. As the pitch of the bump electrodes 5a, 5b becomes smaller, the required alignment accuracy between chips 2, 3 to ensure proper alignment of the electrodes 5a, 5b, is increased. When the detection accuracy of the alignment mark is raised by locally providing the protrusions 6 so as to not cover the alignment mark, the alignment accuracy between the semiconductor chips 2, 3 may be improved.

There is a concern that the insulating resin layer disposed at the entirety of the gap between the semiconductor chips 2, 3 may penetrate between the first bump electrode 5a and the second bump electrode 5b, and thus connectivity may decrease. In contrast, the locally provided protrusions 6 cannot extend between the bump electrodes 5a, 5b, and thus there is a little concern that the connectivity between the bump electrodes 5a, 5b decreases. Accordingly, the connectivity between the first bump electrode 5a and the second bump electrode 5b may be improved. In addition, if the insulating resin layer is disposed at the entirety of the gap between the semiconductor chips 2, 3, entrained voids tend to occur during connection or bonding between the semiconductor chips 2, 3. The voids that are generated in the connection region may cause a state in which the bump connection portion 5 is not covered with the resin, and thus there is a concern that short-circuits may occur between adjacent electrodes thereof. In this embodiment, the bump electrodes 5a, 5b are connected while increasing the connection strength between the semiconductor chips 2, 3 by using the protrusions 6. In addition to this, the filling of the underfill resin 7 is performed. As a result, sealing may be performed in a state in which the bump connection portion 5 is reliably covered, and thus reliability may be raised.

Figure 3:
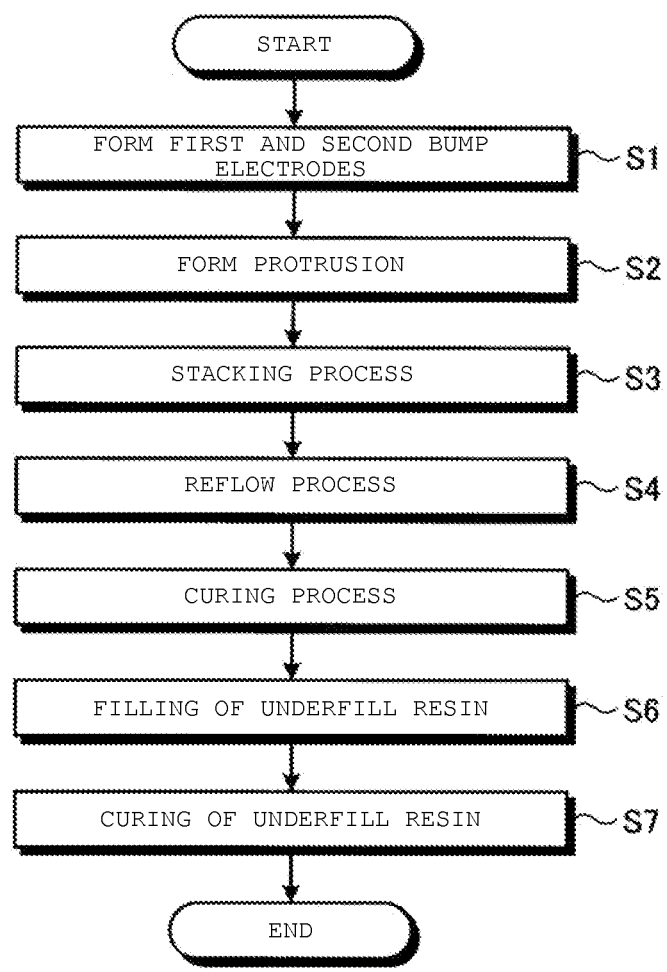
FIG. 3 is a flowchart illustrating a manufacturing process of a semiconductor device.
Figure 4:
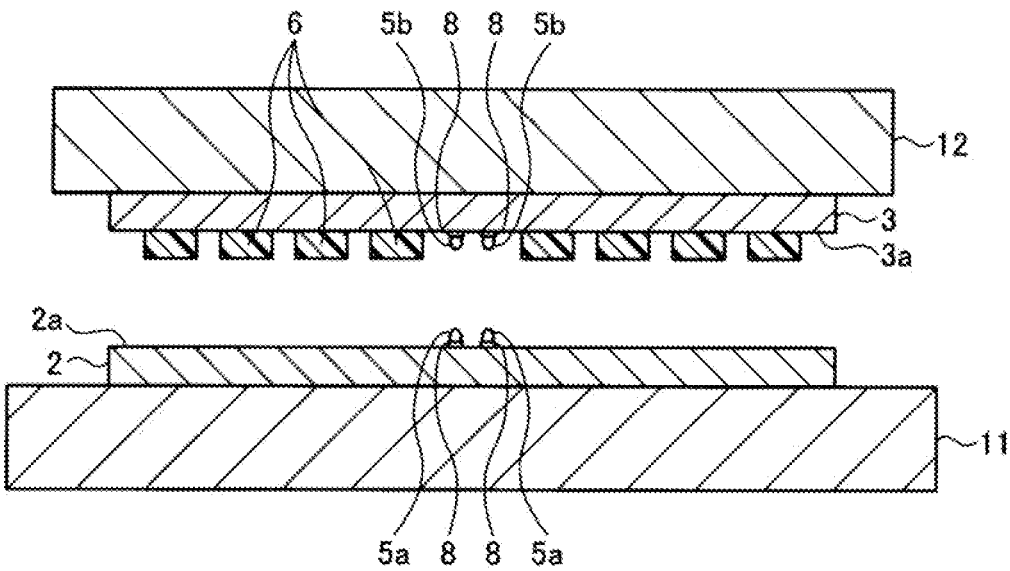
FIG. 4 is a cross-sectional view illustrating the manufacturing process of the semiconductor device.
Figure 5:
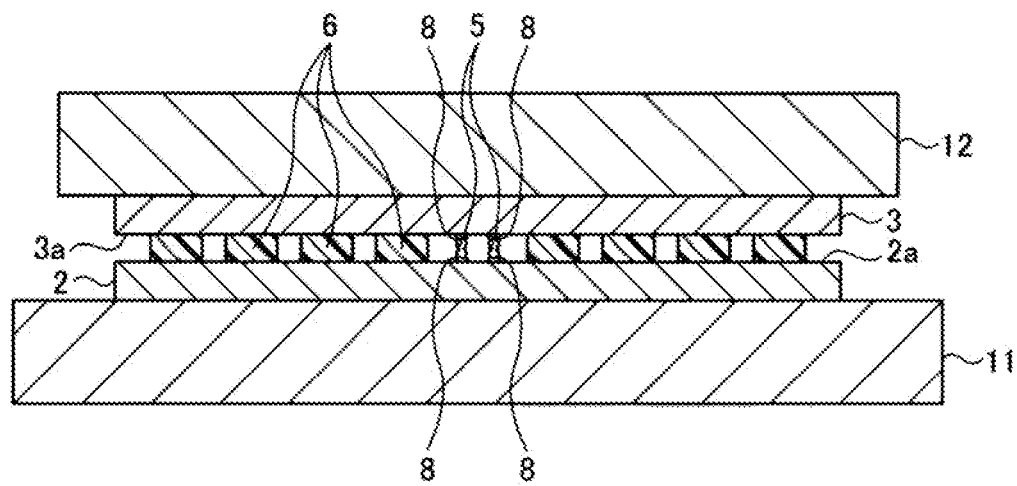
FIG. 5 is a cross-sectional view illustrating the manufacturing process of the semiconductor device.

Next, a manufacturing process of the semiconductor device 10 will be described. FIG. 3 is a flowchart illustrating the manufacturing process of the semiconductor device 10. FIG. 4 is a cross-sectional view illustrating the manufacturing process of the semiconductor device 10. FIG. 5 is a cross-sectional view illustrating the manufacturing process of the semiconductor device 10.

First, the first bump electrodes 5a are formed on the first face 2a of the first semiconductor chip 2, and the second bump electrodes 5b are formed on the second face 3a of the second semiconductor chip 3 (step S1). The first bump electrodes 5a are formed on a surface electrode 8 formed on the surface of the first face 2a. The second bump electrodes 5b are formed on a surface electrode 8 formed on the surface of the second face 3a. The surface electrode 8 is electrically connected to a penetration electrode or an internal wiring that is formed at a semiconductor chip. The surface electrode 8 is formed at a position at which the first semiconductor chip 2 and the second semiconductor chip 3 face each other when being stacked on each other. For example, as the surface electrode 8, copper (Cu), aluminum (Al), nickel (Ni), gold (Au), and the like are used. These metals are not limited to a single layer film, and a stacked film of a plurality of metals may be used. Any one of the first bump electrodes 5a and the second bump electrodes 5b may be omitted.

Next, the protrusions 6 are formed on the second face 3a of the second semiconductor chip 3 (step S2). The protrusions 6 are formed in the second non-connection region on the second face 3a of the second semiconductor chip 3. In this embodiment, the protrusions 6 are formed as a columnar body and are interspersed about the entirety of the non-connection region of the second face 3a. In addition, the protrusions 6 may be formed on the first face 2a of the first semiconductor chip 2, and may be formed on both of the first face 2a and the second face 3a. It is preferable that the protrusions 6 be provided at locations spaced from the first bump electrodes 5a or the second bump electrodes 5b. It is preferable that the protrusions 6 be formed with a thermosetting resin such as an epoxy resin, a polyimide resin, an acrylic resin, or a phenol resin. The protrusions 6 may be formed by employing a lithography technology or an application technology using a dispenser or an inkjet, or may be formed by adhesion of films. In a case of forming the protrusions 6 by applying liquid thermosetting resin composition, it is preferable that the protrusion 6 be retained in a semi-cured state. Alternatively, if it is preferable to shorten a time during bonding and connection between the semiconductor chips 2, 3 a rapid curing type material may be used.

Next, a stacking process of stacking the first semiconductor chip 2 and the second semiconductor chip 3 is performed (step S3). Here, the first semiconductor chip 2 and the second semiconductor chip 3 are temporarily fixed to each other in an overlapping state while the first face 2a and the second face 3a are made to face each other. As illustrated in FIG. 4, the second semiconductor chip 3 is held by suction to a bonding head 12 is disposed over the first semiconductor chip 2 that is placed on a stage 11. For example, alignment between the first semiconductor chip 2 and the second semiconductor chip 3 is performed by detecting the alignment mark of the first and second semiconductor chips 2, 3, for example, by using a camera and the like (not illustrated), and then the chips 2, 3 are placed together as shown in FIG. 5. In addition, the protrusions 6 may be formed to be interspersed without covering the entirety of the first face 2a or the second face 3a, and thus the protrusions 6 may be formed at a position avoiding overlaying the alignment mark. When the protrusion 6 is formed at a position avoiding the alignment mark, detection of the alignment mark is easily and reliably performed.

In addition, the process of step S3 is performed under a temperature environment lower than the melting point of the metals used for the first bump electrode 5a or the second bump electrode 5b and for a period of time for which adhesiveness may be exhibited by the protrusions 6, whereby the first semiconductor chip 2 and the second semiconductor chip 3 are temporarily fixed to each other by the protrusions 6. For example, when being compressed for one second at 150° C., the first semiconductor chip 2 and the second semiconductor chip 3 are temporarily fixed to each other by the protrusions 6. In addition, in the following description, the first semiconductor chip 2 and the second semiconductor chip 3, which are temporarily fixed to each other, are collectively referred to as a chip stacked body.

Next, a reflow process is performed to melt at least a part of the metals that are contained in the first bump electrode 5a formed on the first face 2a or the second bump electrode 5b formed on the second face 3a, thereby bonding the bump electrodes to each other (step S4). For example, the chip stacked body is disposed in a reflow furnace. For example, in the reflow furnace, 250° C. is set as a peak temperature, which is equal to or higher than the melting point of the lead (BP)-free solder used for the second bump electrode 5b. In addition, the chip stacked body is disposed in the reflow furnace for 60 seconds at the peak temperature. Here, for example, the inside of the reflow furnace is maintained at a reducing atmosphere so as to bond the first bump electrode 5a and the second bump electrode 5b while removing any surface oxide film of the first bump electrode 5a and the second bump electrode 5b. The first bump electrode 5a and the second bump electrode 5b are bonded to each other in the reflow process, and thus the first semiconductor chip 2 and the second semiconductor chip 3 are electrically connected to each other through the bump connection portion 5.

Next, a curing process for curing the protrusions 6 formed using the thermosetting resin is performed (step S5). For example, the chip stacked body is disposed in a curing oven for two hours at 180° C., at which curing of the thermosetting resin progresses, which is equal to or lower than the melting point of the metals contained in the first bump electrode 5a or the second bump electrode 5b (in an example of this embodiment, a temperature equal to or lower than that of the melting point of the lead (Pb)-free solder having the lowest melting point among metals contained in the first bump electrode 5a or the second bump electrode 5b). When the protrusions 6 are cured, the first semiconductor chip 2 and the second semiconductor chip 3 are further strongly fixed to one another in comparison to the temporarily fixed state.

Next, the underfill resin 7 is filled between the first face 2a of the first semiconductor chip 2 and the second face 3a of the second semiconductor chip 3 (step S6). Then, the underfill resin 7 is cured (step S7). The semiconductor device 10 is manufactured through the above-described processes. Here, although not illustrated, the semiconductor device 1 is mounted on a circuit base material such as a wiring substrate and a lead frame which has an external connection terminal and is used as semiconductor devices having an SiP structure, and the like. Connection between the semiconductor device 1 and the circuit base material is performed by flip-chip bonding, wire bonding, and the like.

In the semiconductor device 10 according to this embodiment, the first semiconductor chip 2 and the second semiconductor chip 3 are temporarily fixed to each other by the protrusions 6 prior to the reflow process (S4), and thus it is possible to suppress warpage of the semiconductor chips 2, 3 after reflow. Accordingly, it is possible to suppress fracturing of the bump connection portion 5, which is configured with the first bump electrodes 5*a* and the second bump electrodes 5*b* due to the warpage of the semiconductor chips 2, 3, before filling of the underfill resin 7.

In addition, the protrusions 6 are provided to be interspersed on the first face 2*a* or the second face 3*a* of the semiconductor chip 2 or 3, and thus entrained voids are less likely to be generated in comparison to a case in which a protrusion 6 is provided at the entirety of the first face 2*a* or the second face 3*a*. Accordingly, it is possible to achieve improvement in reliability of the semiconductor device 10. In addition, the process of filling the underfill resin 7 (S6) and the process of curing the underfill resin 7 (S7) are performed after the curing process (S5), and thus it is possible to reduce a possibility in which the underfill resin 7 penetrates into the protrusion (s) 6 and thus the protrusion (s) 6 is expanded. The expansion of the protrusion 6 in the direction between the chips 2, 3 may cause the bump connection portion 5 to fracture. According to the semiconductor device 10 according to this embodiment, the expansion of the protrusions 6 is suppressed, and thus it is possible to suppress the fracturing in the bump connection portion 5.

In addition, the protrusions 6 may be formed using a resin having photosensitivity and thermosetting properties. Specific examples of the photosensitive and thermosetting resin include a thermosetting resin that contains a photosensitive agent such as a photosensitive adhesive resin. According to the photosensitive and thermosetting resin, it is possible to spread individual protrusions 6 over the entirety of the non-connection region of the second face 3*a* as individual columnar bodies using photolithography (mask) technology. In addition, the photosensitive and thermosetting resin is thermally cured during the heating as the subsequent process (S5), and thus it is possible to more strongly adhere the first semiconductor chip 2 and the second semiconductor chip 3 together.

Figure 6:
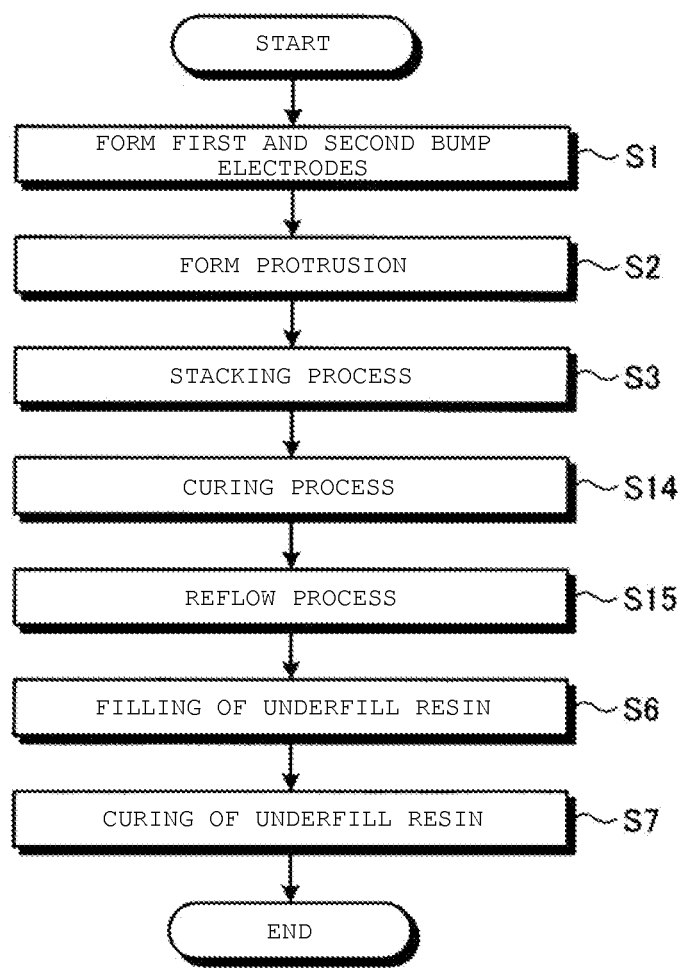
FIG. 6 is a flowchart illustrating a manufacturing process of the semiconductor device illustrated in FIG. 1, and is a flowchart illustrating a manufacturing process as a comparative example.

FIG. 6 is a flowchart illustrating a manufacturing process of the semiconductor device illustrated in FIG. 1, illustrating a manufacturing process as a comparative example. In the manufacturing process as the comparative example, the curing process is formed in step S14, and then the reflow process is performed at step S15. In addition, the sequence of the curing process and the reflow process is opposite to that of the manufacturing process according to the embodiment. The other processes are the same as the manufacturing processes according to this embodiment. In the manufacturing process of the comparative example, the semiconductor chips 2, 3 are fixed to each other by curing the protrusions 6 in the curing process, and then the first bump electrode 5*a* and the second bump electrode 5*b* are bonded to each other by melting at least a part of the metals contained in the first bump electrode 5*a* or the second bump electrode 5*b* in the reflow process.

Here, an organic insulating film (insulating film) such as a polyimide resin film may be provided in some cases as the protective film on the surface of the semiconductor chips 2, 3. Warping tends to occur in the semiconductor chips 2, 3 due to a difference between a coefficient of thermal expansion of a silicon substrate that configures the semiconductor chips 2, 3 and a coefficient of thermal expansion of the polyimide resin. Particularly, as the thickness of the semiconductor chips 2, 3 decreases, the amount of warpage tends to increase. In the process of stacking the semiconductor chips 2, 3 (S3), the warpage of the semiconductor chips 2, 3 is corrected by interposing the chip stacked body between the stage 11 and the bonding head 12. However, when the chip stacked body is taken out from a space between the stage 11 and the bonding head 12, the semiconductor chips 2, 3 tend to be warp again. In the manufacturing process as the comparative example, the semiconductor chips 2, 3 are fixed to each other in the curing process (S14), and thus the semiconductor chips 2, 3 are suppressed from warping again.

However, in the manufacturing process of the comparative example, nickel that is present between the first bump electrode 5*a* and the surface electrode 8, or copper that configures the surface electrode 8 may be diffused into the lead (Pb)-free solder, which is used as the first bump electrode 5*a*, in some cases. When a heterogeneous metal such as nickel and copper is diffused in the lead (Pb)-free solder, the melting point of the lead (Pb)-free solder is raised. When the melting point of the lead (Pb)-free solder is raised, if the temperature in the reflow process (S15) is not raised, there is a possibility that connection failure may occur in the bump connection portion 5. On the other hand, when the temperature in the reflow process (S15) is raised, there is a possibility that residual stress in the connection portion 5 may accordingly increase.

In contrast, in the manufacturing process according to this embodiment, as illustrated in FIG. 3, the reflow process is performed in step S4, and the curing process is performed in step S5. That is, the reflow process is performed before the curing process. Accordingly, it is possible to suppress the diffusion of the heterogeneous metal such as nickel (Ni) and copper (Cu), and thus it is possible to achieve compatibility between reduction of the possibility of connection failure in the bump connection portion 5 and reduction of the residual stress in the connection portion 5.

In addition, in the manufacturing process according to this embodiment, the first semiconductor chip 2 and the second semiconductor chip 3 are temporarily fixed to each other by the protrusions 6 in the stacking process, and thus the semiconductor chips 2, 3 are less likely to warp thereafter. Accordingly, even when the reflow process is performed before the curing process, it is possible to suppress fracturing of the bump connection portion 5 due to warping of the semiconductor chips 2, 3.

Figure 7:
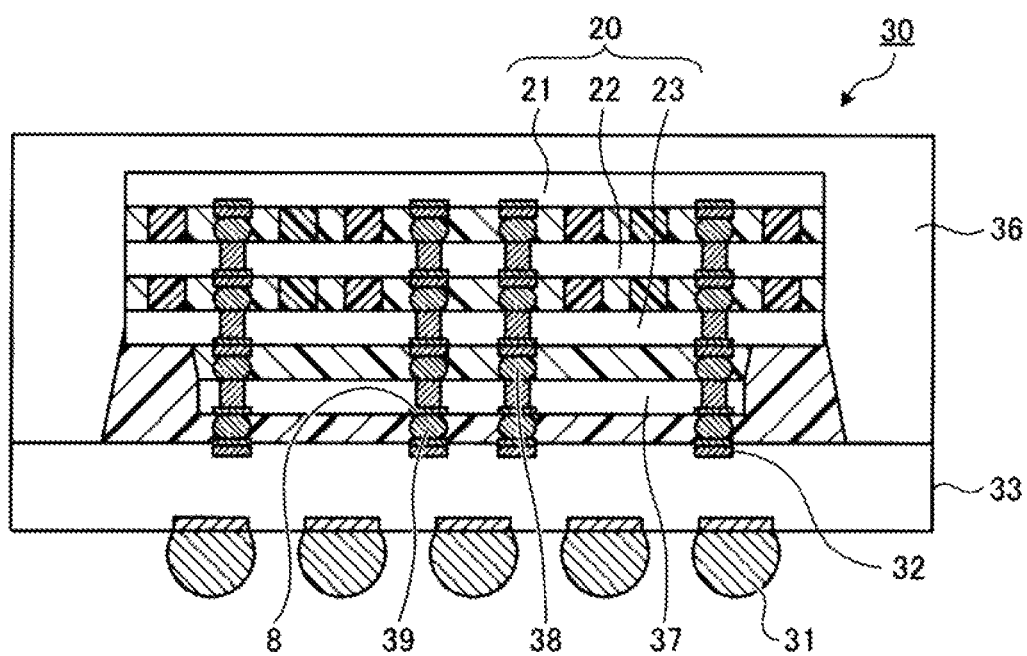
FIG. 7 is a cross-sectional view of a semiconductor device according to a second embodiment.

FIG. 7 is a cross-sectional view of a semiconductor device 30 according to a second embodiment. The semiconductor device 30 includes a first semiconductor chip 21, a second semiconductor chip 22, a third semiconductor chip 23, and a fourth semiconductor chip 37. For example, a NAND flash memory may be used as the first semiconductor chip 21, the second semiconductor chip 22, and the third semiconductor chip 23. In addition, for example, a NAND controller may be used as the fourth semiconductor chip 37. The first semiconductor chip 21, the second semiconductor chip 22, and the third semiconductor chip 23 become a part of a configuration of a chip stacked body 20 that is stacked by the same method as the first embodiment. The semiconductor device 30 is mounted on a wiring substrate 33 that includes an external connection terminal 31 and an internal connection terminal 32. The third semiconductor chip 23 is electrically connected to the fourth semiconductor chip 37 through a third bump electrode 38. The internal connection terminal 32 of the wiring substrate 33 is electrically connected to the fourth semiconductor chip 37 through a surface electrode 8 and a fourth bump electrode 39 which are provided to the fourth semiconductor chip 37. A resin sealing layer 36, which seals all of the chip stacked body 20, the fourth semiconductor chip 37, and the like, is formed on the wiring substrate 33.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, comprising:
    forming a first electrode comprising a metal on a first face of a first semiconductor chip;
    forming a second electrode comprising a metal, and a protrusion, on a second face of a second semiconductor chip;
    aligning the first semiconductor chip with the second semiconductor chip such that the first face and the second face face each other;
    electrically connecting the first semiconductor chip and the second semiconductor chip at a temperature that is higher than a melting point temperature of at least one metal contained in the first electrode and the second electrode in a reflow furnace; and
    curing the protrusion at a temperature that is lower than the melting point temperature of the metals contained in the first electrode and the second electrode after electrically connecting the first semiconductor chip and the second semiconductor chip in the reflow furnace.

2. The method according to claim 1, further comprising:
    filling an underfill resin between the first face and the second face after curing the protrusion, and then curing the underfill resin.

3. The method according to claim 1,
    wherein the protrusion comprises a plurality of columnar bodies extending from the second face.

4. The method according to claim 3,
    wherein the plurality of columnar bodies are formed using a photolithographic process.

5. The method according to claim 1, further comprising:
    pressing the first semiconductor chip and the second semiconductor chip together when the first and second semiconductor chips are at the temperature that is higher than the melting point temperature in the reflow furnace.

6. The method according to claim 1, wherein the protrusion is formed of a thermosetting resin.

7. The method according to claim 1, further comprising:
    forming the protrusion on the second semiconductor chip, such that the protrusion has a height equal to a desired gap between the first semiconductor chip and the second semiconductor chip.

8. A method of forming a semiconductor device comprising:
    providing a first semiconductor chip having a connection portion having at least one electrode extending therefrom and an open portion having an alignment mark thereon, said at least one electrode on the first semiconductor chip containing at least two different metals;
    providing a second semiconductor chip having a connection portion having at least one electrode extending therefrom and an open portion having an alignment mark thereon, said at least one electrode on the second semiconductor chip containing at least two different metals;
    providing a plurality of protrusions extending from the open portion of the first semiconductor chip;
    positioning the open portion of the first semiconductor chip so as to face the open portion of the second semiconductor chip using the alignment mark of at least one the first and second semiconductor chips;
    pressing the first and second semiconductor chips together such that the electrodes of the connection portions of the first and second semiconductor chips are in contact with each other and end portions of the protrusions adhere to the open portion of the second semiconductor chip, to form a stacked chip body;
    heating the stacked chip body in a reflow furnace that is set at a reflow temperature, so as to melt at least one electrode on the first and second semiconductor chips; and
    curing the protrusions at a curing temperature after heating the stacked chip body in the reflow furnace, the curing temperature being lower than a lowest temperature of melting points of the metals of the electrodes of the first and second semiconductor chips.

9. The method of claim 8, wherein the reflow temperature is greater than a temperature at which the end portions of the protrusions were adhered to the open portion of the second semiconductor chip.

10. The method of claim 8, further comprising:
    injecting a resin into a space between the first semiconductor chip and the second semiconductor chip; and
    curing the resin at a resin curing temperature that is lower than the curing temperature,
    wherein the protrusions are formed of a thermosetting resin.

11. The method of claim 8, wherein
    the protrusions have a height equal to a desired gap between the first semiconductor chip and the second semiconductor chip in the stacked chip body.

12. The method of claim 8, wherein
    the protrusions have a height less than the sum of a height of the at least one electrode on the first semiconductor chip and a height of the at least one electrode on the second semiconductor chip.

13. The method of claim 8, wherein the protrusions are columnar.

14. The method of claim 1, wherein
    the first electrode is formed on a first surface electrode that is formed on the first face of the first semiconductor chip, the first surface electrode being formed of a material different from the first electrode.

15. The method of claim 1, wherein
    the second electrode is formed on a second surface electrode that is formed on the second face of the second semiconductor chip, the second surface electrode being formed of a material different from the second electrode.

16. The method of claim 8, wherein
    the connection portion on the first semiconductor chip is formed of a material different from said at least one electrode on the first semiconductor chip.

17. The method of claim 8, wherein
    the connection portion on the second semiconductor chip is formed of a material different from said at least one electrode on the second semiconductor chip.

* * * * *